United States Patent
Shepard et al.

(10) Patent No.: US 8,995,183 B2
(45) Date of Patent: Mar. 31, 2015

(54) DATA RETENTION IN NONVOLATILE MEMORY WITH MULTIPLE DATA STORAGE FORMATS

(75) Inventors: Zac Shepard, San Jose, CA (US); Steven T. Sprouse, San Jose, CA (US); Chris Nga Yee Avila, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 424 days.

(21) Appl. No.: 13/453,921

(22) Filed: Apr. 23, 2012

(65) Prior Publication Data

US 2013/0279248 A1 Oct. 24, 2013

(51) Int. Cl.
| G11C 11/34 | (2006.01) |
| G11C 11/56 | (2006.01) |
| G11C 16/04 | (2006.01) |
| G11C 16/34 | (2006.01) |

(52) U.S. Cl.
CPC ........ *G11C 11/5628* (2013.01); *G11C 16/0483* (2013.01); *G11C 16/3418* (2013.01); *G11C 16/349* (2013.01); *G11C 2211/5641* (2013.01)
USPC ............ 365/185.03; 365/185.17; 365/185.11; 365/230.03

(58) Field of Classification Search
USPC ............................ 365/185.03, 185.17, 185.11
See application file for complete search history.

(56) References Cited

U.S. PATENT DOCUMENTS

| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,595,924 | A | 1/1997 | Yuan et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 6,272,052 | B1 | 8/2001 | Miyauchi |
| 7,057,939 | B2 | 6/2006 | Li et al. |
| 7,370,310 | B1 | 5/2008 | Saini et al. |
| 8,040,744 | B2 | 10/2011 | Gorobets et al. |
| 8,094,500 | B2 | 1/2012 | Paley et al. |
| 2007/0113030 | A1 | 5/2007 | Bennett et al. |
| 2008/0112238 | A1* | 5/2008 | Kim et al. ..................... 365/200 |
| 2008/0198651 | A1* | 8/2008 | Kim .......................... 365/185.03 |
| 2010/0174845 | A1 | 7/2010 | Gorobets et al. |
| 2010/0174846 | A1 | 7/2010 | Paley et al. |
| 2010/0174847 | A1 | 7/2010 | Paley et al. |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Han Yang
(74) *Attorney, Agent, or Firm* — Davis Wright Tremaine LLP

(57) ABSTRACT

In a nonvolatile memory that stores data in two or more different data storage formats, such as binary and MLC, a separation scheme is used to distribute blocks containing data in one data storage format (e.g. binary) so that they are separated by at least some minimum number of blocks using another data storage format (e.g. MLC).

16 Claims, 14 Drawing Sheets

(56) References Cited

U.S. PATENT DOCUMENTS

2011/0075482 A1 3/2011 Shepard et al.
2012/0250408 A1* 10/2012 Takeyama et al. ....... 365/185.03

OTHER PUBLICATIONS

U.S. Appl. No. 61/142,620 entitled "Balanced Performance for On-Chip Folding on Non-Volatile Memories," filed Jun. 9, 2011, 144 pages.

* cited by examiner

Multistate Memory

Lower Page Programming (2-bit Code)

Upper Page Programming (2-bit Code)

Lower Page Read (2-bit Code)

Upper Page Read (2-bit Code)

| Plane 0 | Plane 1 |
|---------|---------|
| MLC | MLC |
| MLC | MLC |
| MLC | Binary |
| MLC | Binary |
| MLC | MLC |
| Binary | MLC |
| Binary | MLC |
| Binary | MLC |
| Binary | MLC |
| MLC | MLC |
| MLC | MLC |
| MLC | MLC |
| MLC | MLC |
| MLC | MLC |

*FIG. 9*

DATA RETENTION IN NONVOLATILE MEMORY WITH MULTIPLE DATA STORAGE FORMATS

BACKGROUND

This application relates to the operation of re-programmable non-volatile memory systems such as semiconductor flash memory, and, more specifically, to the arrangement of data in a memory array that stores data in multiple data storage formats with different charge densities.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency. These undesirable attributes make disk-based storage impractical in most mobile and portable applications. On the other hand, flash memory, both embedded and in the form of a removable card is ideally suited in the mobile and handheld environment because of its small size, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is to rewrite the update data in the same physical memory location. That is, the logical to physical address mapping is unchanged. However, this will mean that the entire erase block containing that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Data communicated through external interfaces of host systems, memory systems and other electronic systems are addressed and mapped into the physical locations of a flash memory system. Typically, addresses of data files generated or received by the system are mapped into distinct ranges of a continuous logical address space established for the system in terms of logical blocks of data (hereinafter the "LBA interface"). The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive.

Flash memory systems are commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In current commercial flash memory systems, the size of the erase unit has been increased to a block of enough memory cells to store multiple sectors of data. Indeed, many pages of data are stored in one block, and a page may store multiple sectors of data. Further, two or more blocks are often operated together as metablocks, and the pages of such blocks logically linked together as metapages. A page or metapage of data are written and read together, which can include many sectors of data, thus increasing the parallelism of the operation. Along with such large capacity operating units the challenge is to operate them efficiently.

For ease of explanation, unless otherwise specified, it is intended that the term "block" as used herein refer to either the block unit of erase or a multiple block "metablock," depending upon whether metablocks are being used in a specific system. Similarly, reference to a "page" herein may refer to a unit of programming within a single block or a "metapage" within a metablock, depending upon the system configuration.

In some memory systems, problems may occur in relation to the retention of data after it has been programmed into a memory array. Several mechanisms may cause data to be incorrectly read or unreadable after a period of storage in the memory array. Even where the memory system is not exposed to any severe or unusual influences, data retention may be less than ideal. In general, data retention becomes worse as critical dimensions of memory arrays become smaller.

There is a general need for a memory system that maintains high data retention even as critical dimensions of memory cells become smaller.

SUMMARY OF THE INVENTION

According to an aspect of the present invention, where a memory system stores data in multiple data formats, such as binary and MLC, the data may be arranged so that there are no large physical areas of a particular data format (e.g. no large areas of binary data). This may avoid certain data retention problems that are caused by physically grouping data in a particular format. For example, in a memory in which some blocks store data in binary format, and some blocks store data in MLC format, blocks containing binary data may be separated from each other by MLC blocks so that each binary block is separated from another binary block by at least some minimum spacing. Arrangements of data may be based on some separation scheme such as a fixed separation between binary blocks, or some variable separation between binary blocks.

A method of assigning locations for two-state data storage in a nonvolatile memory that stores data in both two-state per cell form and multi-state per cell form may include: assigning a first physical location for storage of a first unit of data in two-state per cell form in relation to a second physical location of a second unit of data in two-state per cell form according to a separation scheme such that the first physical location and the second physical location are separated by at least a predetermined minimum number of physical locations that store data in multi-state per cell form.

Each physical location may correspond to an erase block. The first location and the second location may be in the same plane of the nonvolatile memory. The separation scheme may be applied without regard to physical locations of units of data in two-state per cell form that are stored in other planes of the nonvolatile memory. The method may also include assigning a third physical location for storage of a third unit of data in two-state per cell form according to the separation scheme such that the third physical location is separated from the first physical location by at least the predetermined minimum number of physical locations that store data in multi-state per cell form, and the third physical location is separated from the second physical location by at least the predetermined minimum number of physical locations that store data in multi-state per cell form. The minimum number may be calculated from the number of erase blocks in the memory array and the number of erase blocks needed for two-state per cell storage. The separation scheme may assign the first physical location and the second physical location according to a repetitive pattern that maintains a fixed separation between erase blocks containing data in two-state per cell form. The separation scheme may assign the first physical location and the second physical location according to an algorithm that allows a variable separation between erase blocks containing data in two-state per cell form, the variable separation being at least the predetermined minimum number of physical locations.

A method of assigning physical addresses for storage of data in low charge-density format, and high charge-density format, in a nonvolatile floating gate memory array, may include: assigning physical addresses for storage of data in low charge-density format in a repeating pattern with intervals between the physical addresses for storage of data in low charge-density format; and assigning data in high charge-density format to the intervals between the physical addresses for storage of data in low charge-density format.

The low charge-density format may be storage of one bit of data per memory cell, and high charge-density may be storage of more than one bit of data per memory cell. The low charge-density format may be storage using a first number of memory states per cell and high charge-density format may be storage using a second number of memory states per cell, the second number being greater than the first number.

A nonvolatile floating-gate memory system may include: an array of floating-gate memory cells, an individual cell of the array of floating-gate memory cells being configurable to either (a) store one bit of data, or (b) store more than one bit of data; and a physical assignment unit that assigns units of data that are to be stored in the array of floating-gate memory cells to physical locations in the array of floating-gate memory cells according to a separation scheme such that first portions of the memory array that store one bit of data per cell are separated from each other by second portions of the memory array that store more than one bit of data per cell.

The array of floating-gate memory cells may be formed in planes, with each plane having a separate well providing isolation from other planes, and wherein within an individual plane, erase blocks of cells configured to store one bit of data per cell are separated by at least a minimum number of erase blocks of cells configured to store more than one bit per cell. Erase blocks of cells configured to store one bit of data per cell may be separated from each other by a uniform number of erase blocks of cells configured to store more than one bit per cell.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 9 shows two planes of a memory array that stores data in both binary blocks and MLC blocks.

DETAILED DESCRIPTION

Memory System

Figure 1:
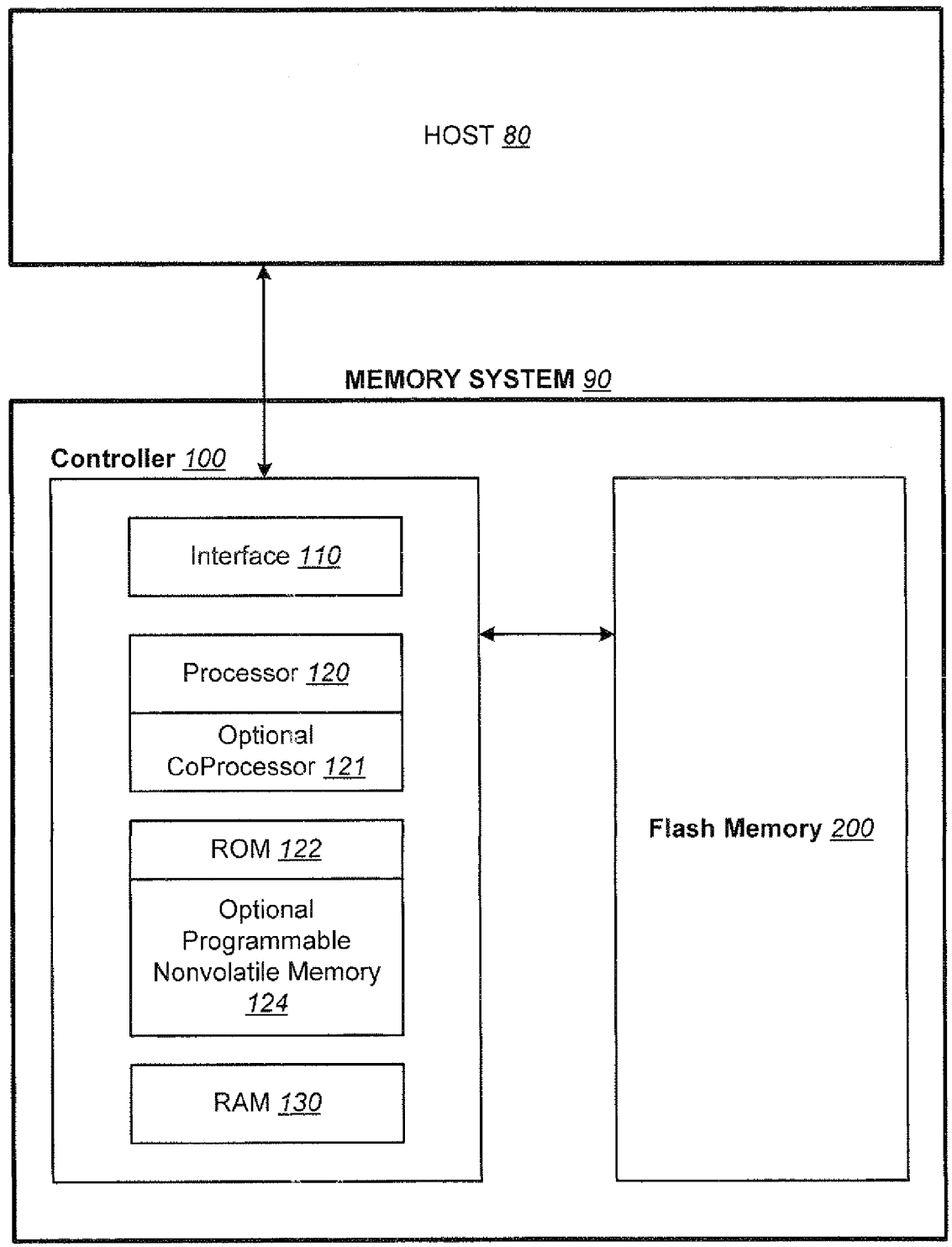
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 whose operations are controlled by a controller 100. The memory 200 comprises one or more arrays of non-volatile memory cells distributed over one or more integrated circuit chips. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
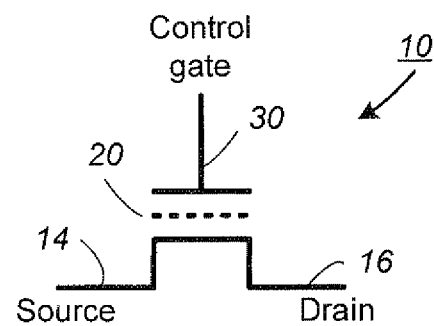
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
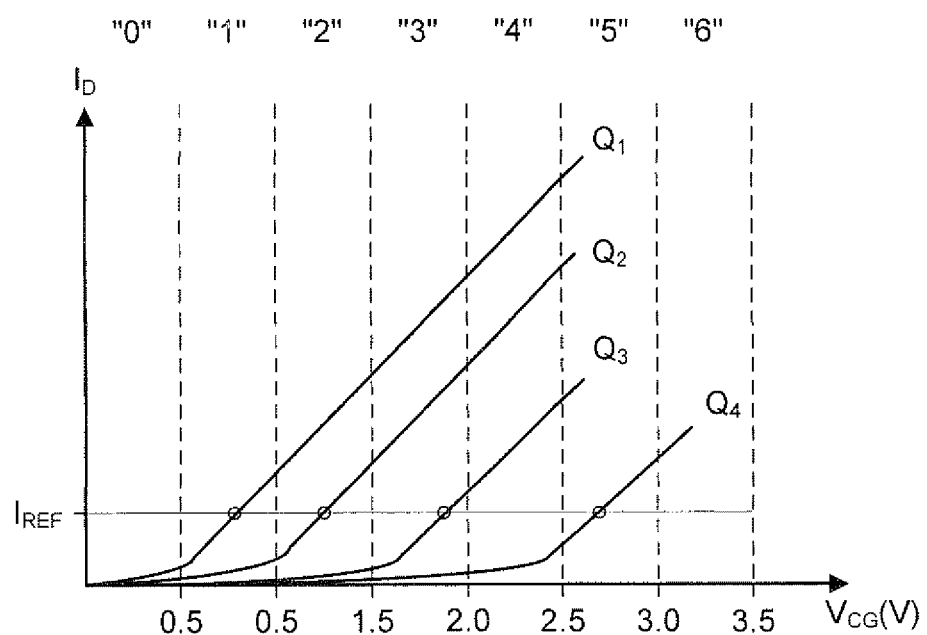
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
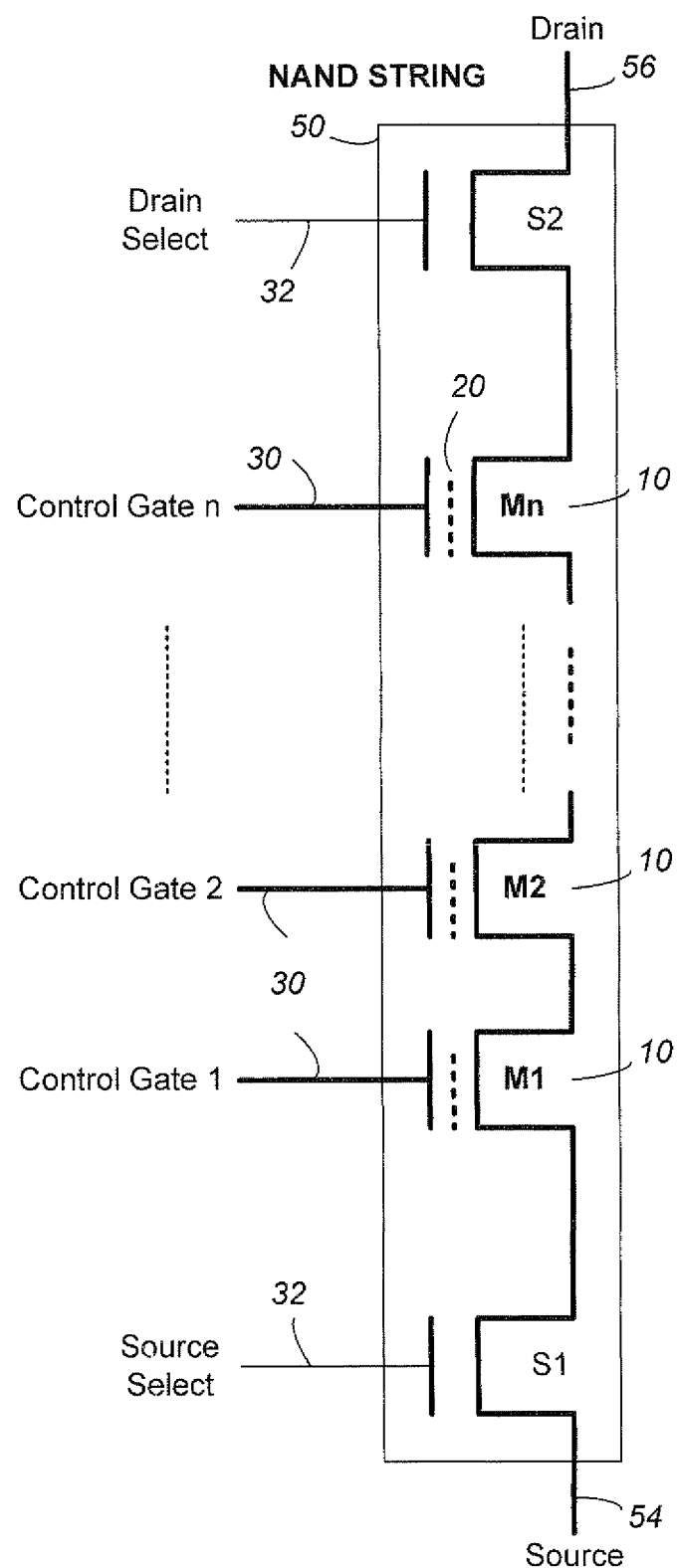
FIG. 4A illustrates schematically a string of memory cells organized into a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
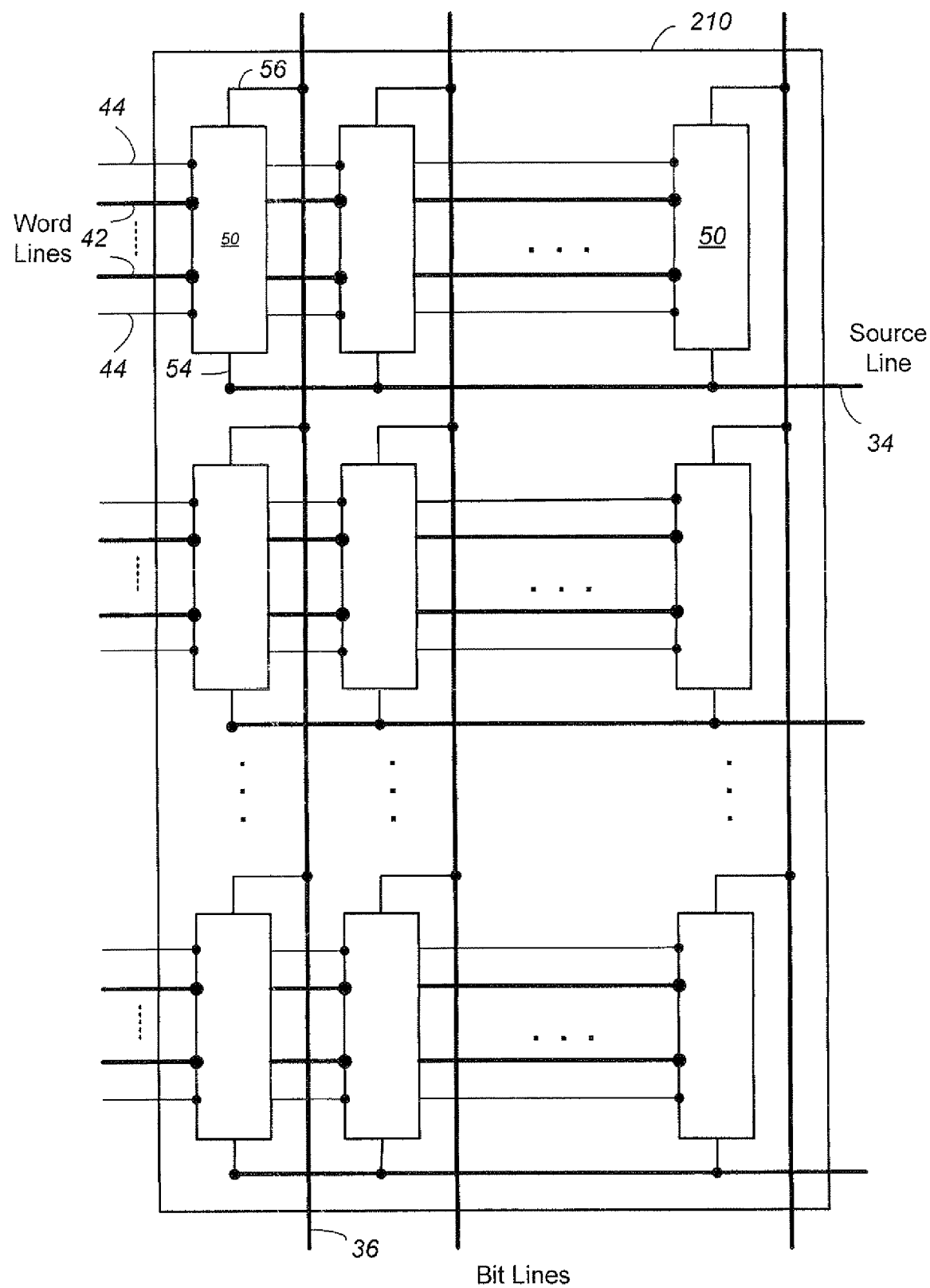
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
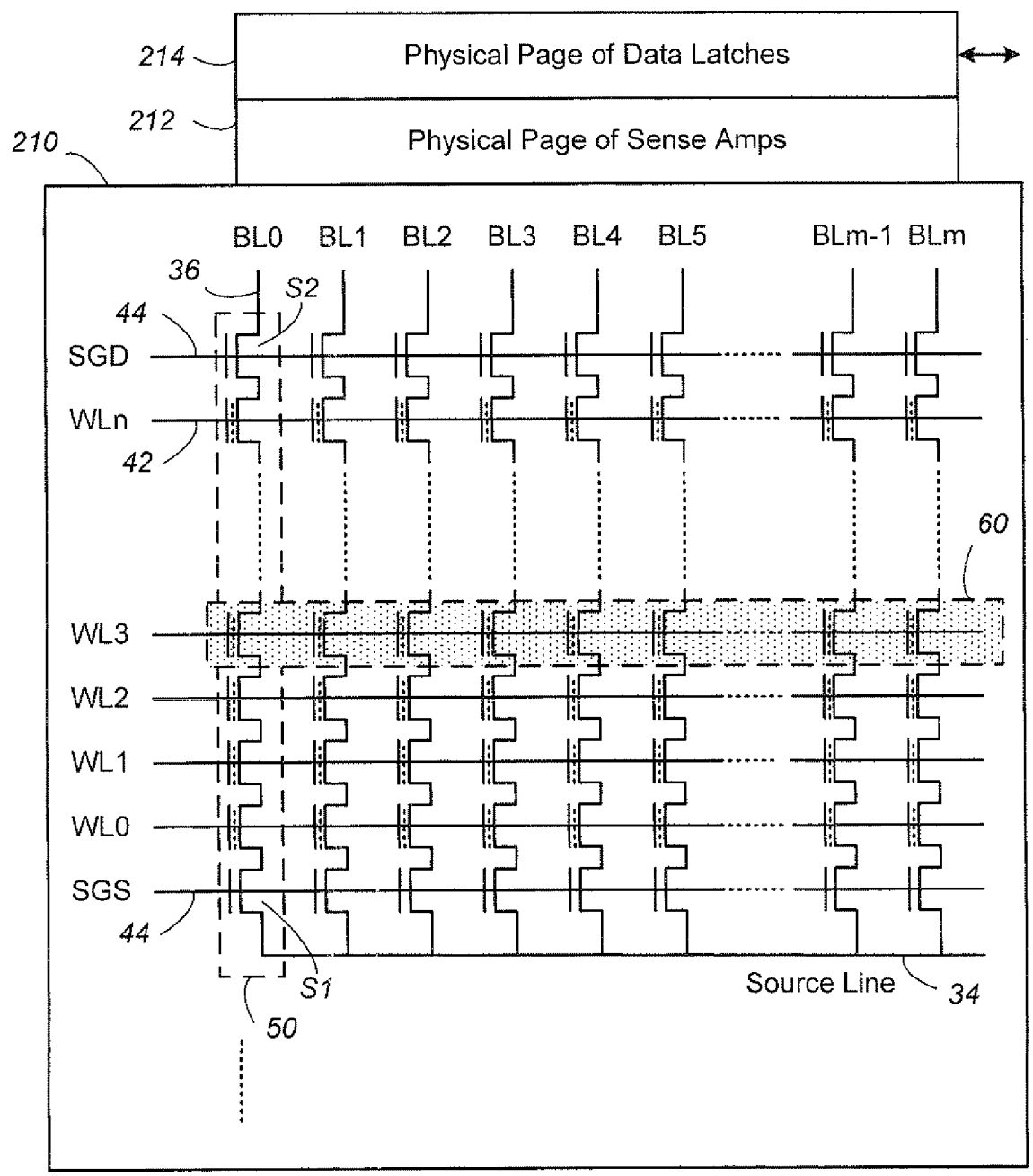
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-level. Cell ("MLC") Memory Partitioning

A nonvolatile memory in which each memory cell stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-Bit, Full-Sequence MLC Programming

Figure 6:
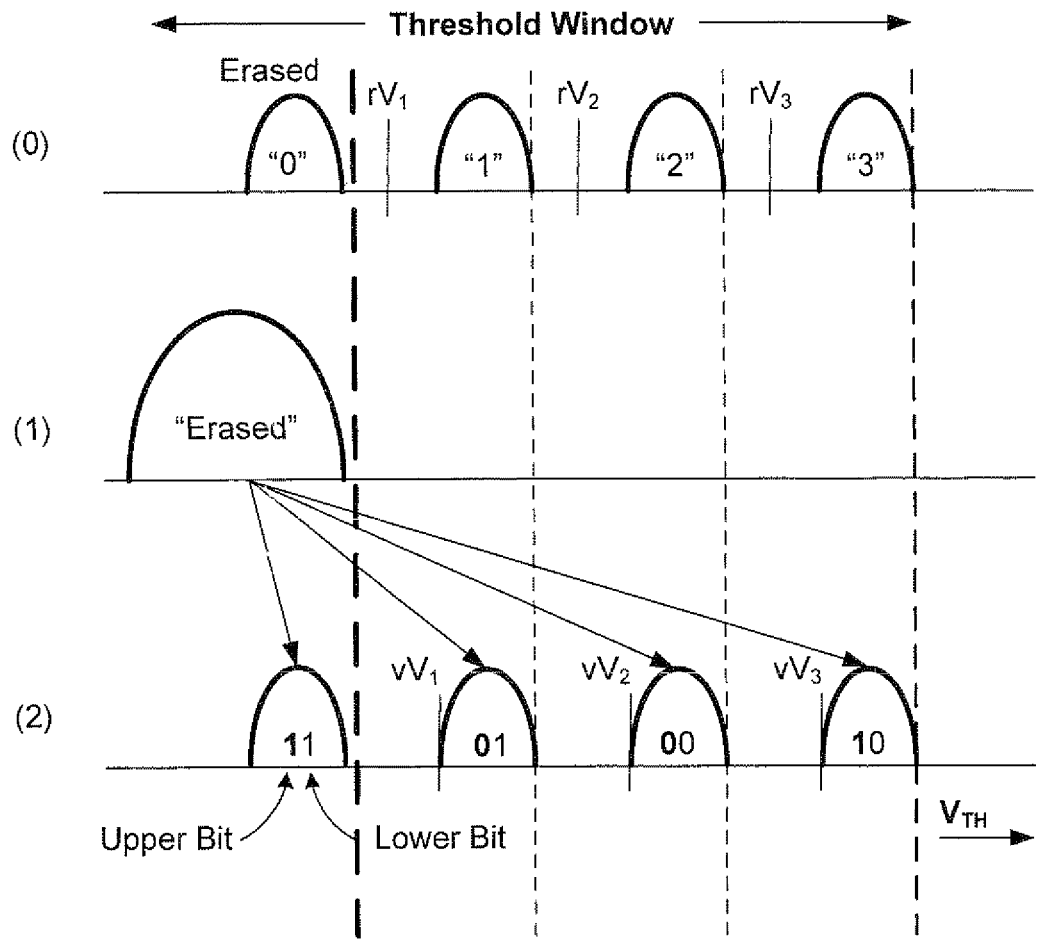
FIG. 6(0)-6(2) illustrate an example of programming a population of 4-state memory cells.

FIG. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-By-Bit MLC Programming and Reading

Figure 7A:
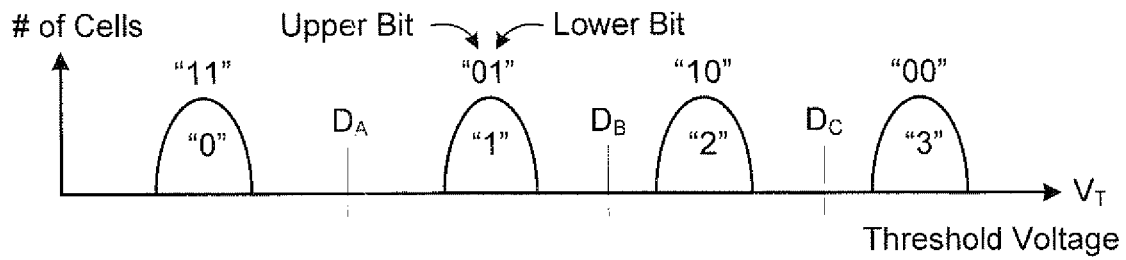
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. patent application Ser. No. 10/830,824 filed Apr. 24, 2004 by Li et al., entitled "NON-VOLATILE MEMORY AND CONTROL WITH IMPROVED PARTIAL PAGE PROGRAM CAPABILITY".

Figure 7B:
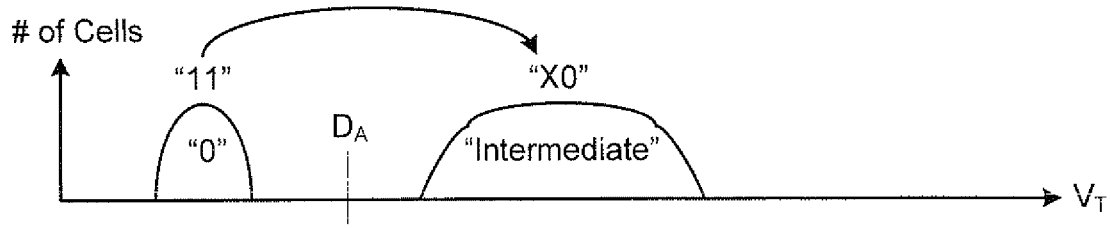

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
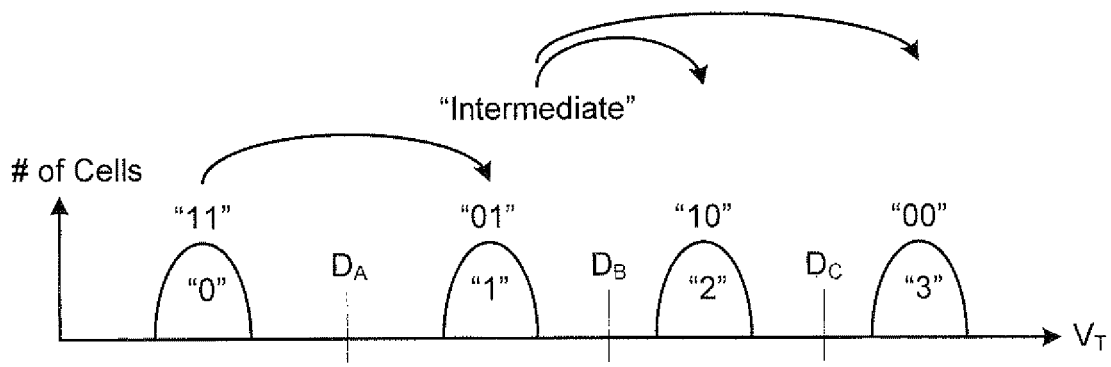

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
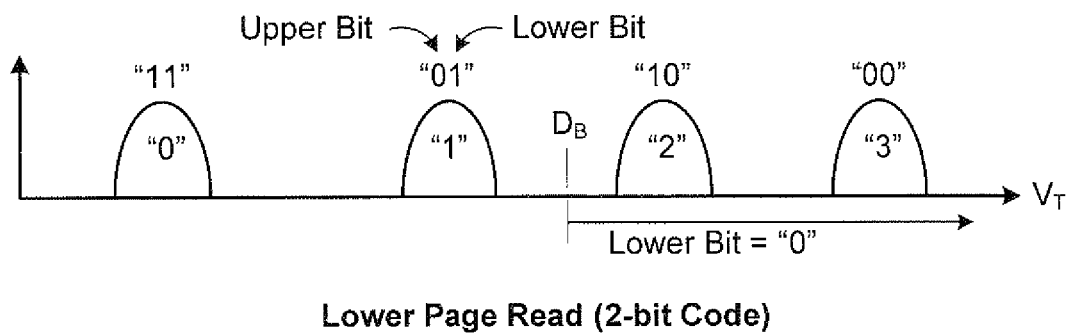

FIG. 7D illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7E:
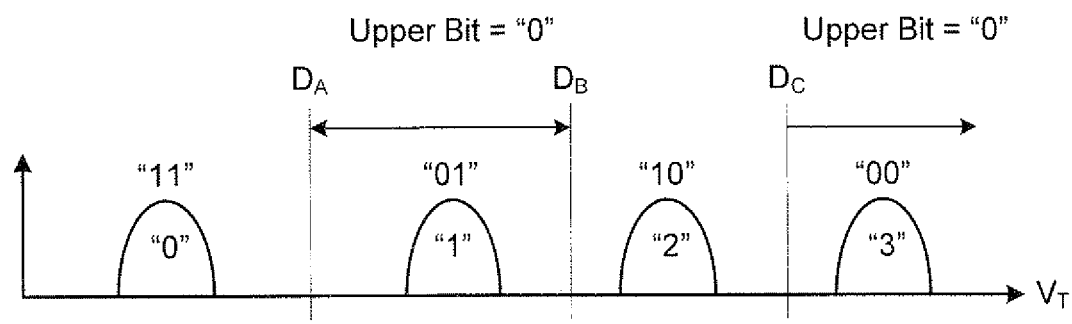

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution for programming and reading will necessarily become finer. Two issues arise as the memory cell is configured to store more bits.

First, programming or reading will be slower when the threshold of a cell must be more accurately programmed or read. In fact, in practice the sensing time (needed in programming and reading) tends to increase as the square of the number of partitioning levels.

Secondly, flash memory has an endurance problem as it ages with use. When a cell is repeatedly programmed and erased, charge is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa, so that both data storage formats are used in the same memory, and individual blocks are configurable to be used for MLC data at one time and binary data another time. It should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between, neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique may be compromised by partial-page programming. A page is a group of memory cells, typically along a row or word line, that is programmed together as a unit. It is possible to program non overlapping portions of a page individually over multiple programming passes. However, because not all cells of the page are programmed in a final pass together, it may create large difference in charges programmed among the cells after the page is done. Thus partial-page programming may result in more program disturb and may require a larger margin for sensing accuracy.

In the case the memory is configured to support binary data storage, the margin of operation is wider than that of MLC. In one example, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

Figure 8:
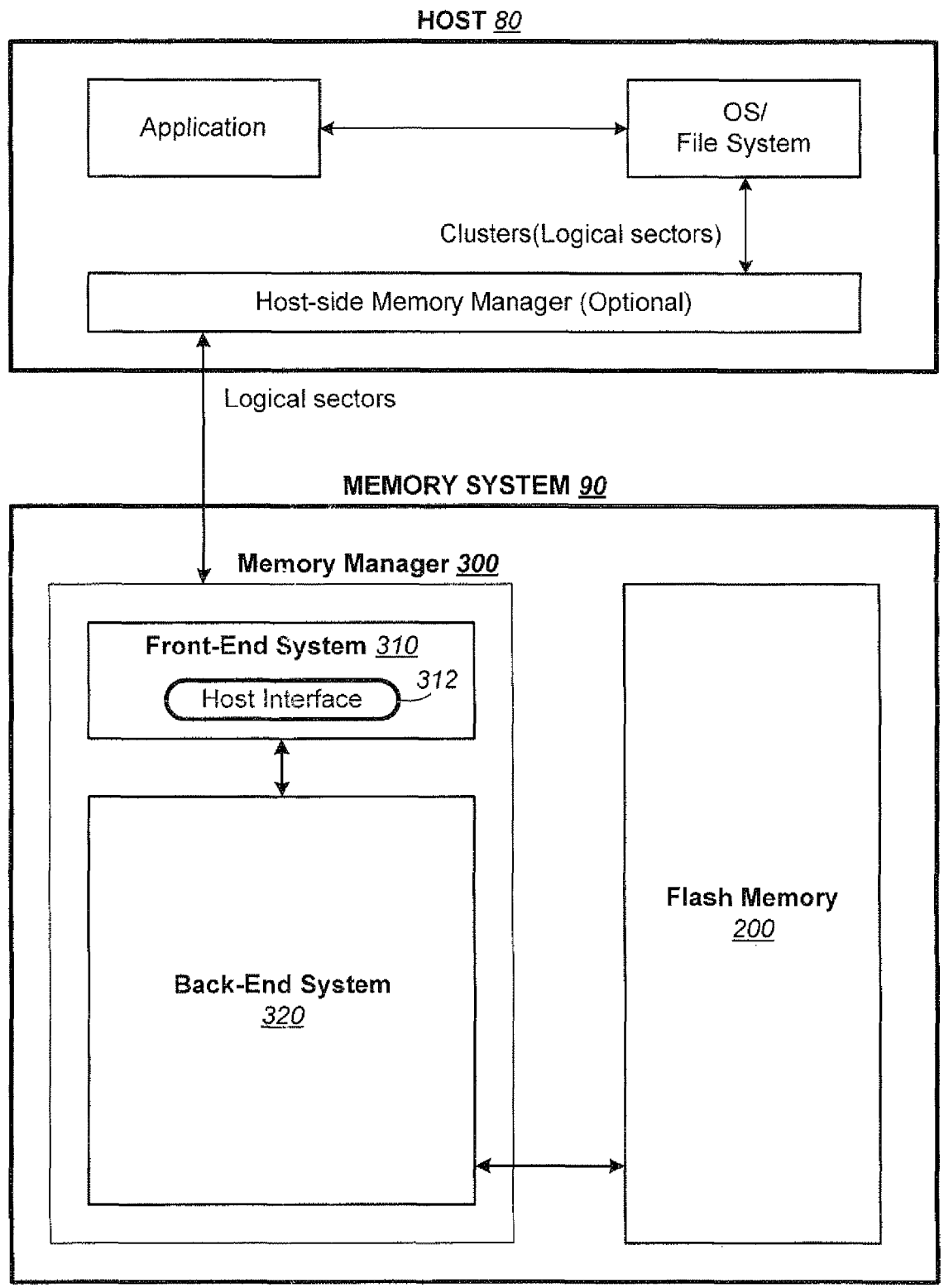
FIG. 8 illustrates the memory being managed by a memory manager with is a software component that resides in the controller.

FIG. 8 illustrates a memory being managed by a memory manager which is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Memories Having Multi-Level and Binary Portions

Memory Partitioned into Main and Binary Cache Portions

A number of memory system arrangements where the non-volatile memory includes both binary and multi-level sections will now be described. In a first of these, in a flash memory having an array of memory cells that are organized into a plurality of blocks, the cells in each block being erased together, the flash memory is partitioned into at least two portions. A first portion forms the main memory for storing mainly user data. Individual memory cells in the main memory being configured to store one or more bits of data in each cell. A second portion forms a cache for data to be written to the main memory. The memory cells in the cache portion are configured to store fewer bits of data in each cell than that of the main memory. Both the cache portion and the main memory portion operate under a block management system for which cache operation is optimized. A more detailed presentation of this material is developed in the following U.S. patent application or provisional application Ser. Nos. 12/348,819; 12/348,825; 12/348,891; 12/348,895; 12/348,899; and 61/142,620, all filed on Jan. 5, 2009.

In one example, individual cells in the cache portion are each configured to store one bit of data while the cells in the main memory portion each stores more than one bit of data. The cache portion then operates as a binary cache with faster and more robust write and read performances.

In one example, the cache portion is configured to allow finer granularity of writes than that for the main memory portion. The finer granularity is more compatible with the granularity of logical data units from a host write. Due to requirement to store sequentially the logical data units in the blocks of the main memory, smaller and chaotic fragments of logical units from a series of host writes can be buffered in the cache portion and later reassembled in sequential order in the blocks in the main memory portion.

In one example, the decision for the block management system to write data directly to the main portion or to the cache portion depends on a number of predefined conditions. The predefined conditions include the attributes and characteristics of the data to be written, the state of the blocks in the main memory portion and the state of the blocks in the cache portion.

The Binary Cache generally has the follows features and advantages: a) it increases burst write speed to the device; b) it allows data that is not aligned to pages or meta-pages to be efficiently written; c) it accumulates data for a logical grouping, to minimize the amount of data that must be relocated during garbage collection of a block after the data has been archived to the block; d) it stores data for a logical grouping in which frequent repeated writes occur, to avoid writing data for this logical grouping to the block; and e) it buffers host data, to allow garbage collection of the block to be distributed amongst multiple host busy periods.

Data Retention

In an ideal nonvolatile memory, once data is stored in a memory array that data remains available to be read at any time thereafter. However, in real memories, some changes may occur in such stored data over time. For example, in a charge storage memory, some charge may leak from a charge storage structure, such as a floating gate, over time. These changes may cause data to be misread at a later time. While ECC may be able to detect and correct some errors, this incurs some overhead, and ECC can only correct a limited number of errors. If this limit is exceeded the data is uncorrectable. Some of the changes in stored data may occur because of physical defects in the memory array, or because of the effects of wear on the memory cells. However, even in memories that do not suffer from physical defects or significant wear, it has been found that data retention may be significantly reduced by certain physical arrangements of data in a memory array.

Data retention may be degraded in programmed areas of a floating gate memory array that are adjacent to erased blocks, in particular during surface mounting, or other processing that may subject memory chips to elevated temperatures, due to a phenomenon referred to as "global charge effect". Examples of such data retention problems and their solutions are discussed in U.S. Patent Application Publication Number 2011/0075482, to Shepard et al (publication date Mar. 31, 2011). Specifically, a solution is described in which erased blocks are programmed to higher threshold voltages prior to surface mounting. Then, after surface mounting, the previously erased blocks are returned to the erased state.

It has been found that data retention may also be degraded in areas of a floating gate memory array that are programmed using a data storage format that results in relatively high charge levels (e.g. MLC) when such areas are adjacent to areas of the memory array that are programmed using a data storage format that results in relatively low charge levels (e.g. binary). Such degradation is not always limited to surface mounting or other high temperature processing (though it may be exacerbated by higher temperatures). In memory arrays that contain both MLC blocks and binary cache blocks, as described above, cells of MLC blocks may on average be programmed to higher charge levels than cells of binary cache blocks (see for example FIGS. 7B and 7C). Furthermore, because of the nature of the data written to binary cache blocks they may contain significant areas that remain unwritten for an extended period. The result is that binary cache blocks may contain significantly less charge than MLC blocks. It is believed that this lower amount of charge causes some groups of binary blocks to act as "aggressor blocks" in a similar manner to the erased blocks described in U.S. Patent Application Publication Number 2011/0075482. The relatively concentrated charge in MLC blocks results in forces that tend to disperse the concentrated charge and the presence of areas of less concentrated charge in nearby binary cache blocks provides an attractive destination for such charge. An MLC block that is adjacent to such a grouping of binary cache blocks may suffer from degraded data retention, apparently because of movement of charge from the more highly charged MLC block towards less charged binary blocks.

FIG. 9 shows an example of two planes (plane 0 and plane 1) of a nonvolatile memory array. Both planes contain both binary and MLC blocks. Plane 0 contains four binary blocks together in a contiguous grouping. This arrangement creates an aggressor block that affects nearby MLC blocks in Plane 0. In this example, the four MLC blocks on either side of the aggressor block (shaded) show degraded data retention because of the aggressor group. However, the aggressor group in plane 0 does not affect any block in plane 1. In this design, plane 0 and plane 1 are isolated from each other by being formed in separate wells. While plane 1 has two binary blocks together, in this example they do not form an aggressor block, and none of the MLC blocks of plane 1 have degraded data retention. It should be understood that the mechanism for data retention degradation is dependent on the particular memory design, and that the example shown is for illustration only. Other memory designs may show degradation from a single binary block, while others may show no degradation from even large groupings of binary blocks. Furthermore, while the planes in this example are isolated, and there is no degradation of data retention in one plane from an aggressor group in another plane, this may not be the case in other designs. It is generally understood that as dimensions are reduced in memory designs that the problems of data retention become more acute. Physical configurations of data that do not suffer from significant data retention problems when stored in a memory array with a certain critical dimension may suffer from data retention problems when the critical dimension is reduced.

Figure 10:
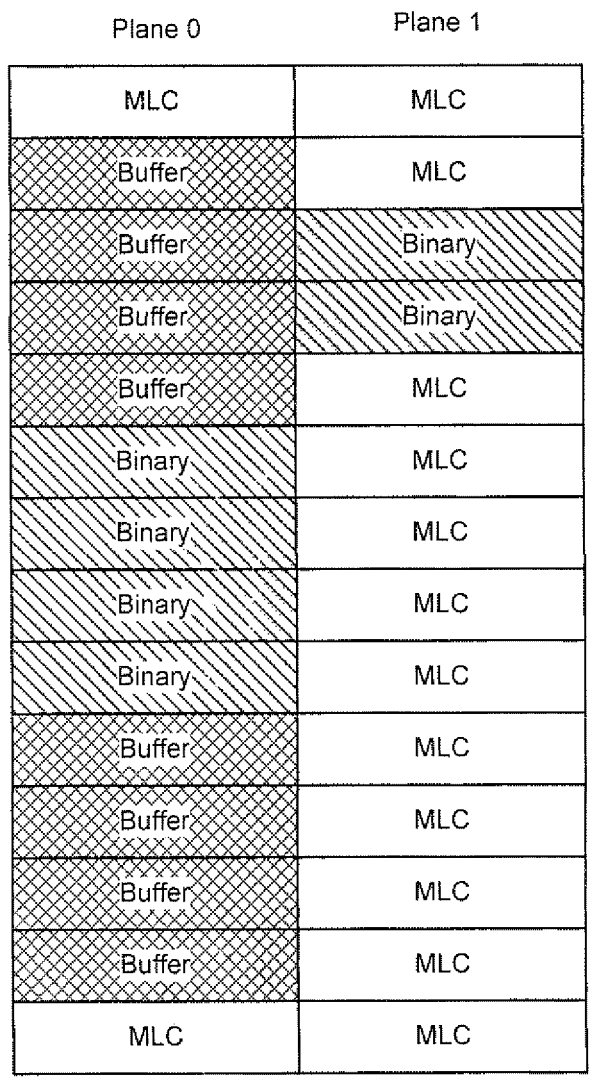
FIG. 10 shows buffer blocks, on either side of binary blocks in plane 0, for separating a group of binary blocks from MLC blocks.

One way to mitigate or eliminate problems associated with binary blocks is to physically separate binary blocks from MLC blocks. This can be done by using a buffer between binary blocks and MLC blocks. For example, as shown in FIG. 10, a certain number of blocks (in this case four blocks) that are adjacent to the binary cache blocks may be maintained in an unwritten state, as a buffer between the binary cache blocks and MLC blocks. In other words, the blocks that would be affected by the binary blocks are simply left unused. However, such a solution is wasteful of space in the memory array. As can be seen from FIG. 10, eight blocks are used to maintain MLC blocks in this example, four on either side of the binary blocks. While no buffer is required in Plane 1 in this example, in some cases buffer blocks might be required in many planes resulting in a considerable waste of space in the memory array.

Figure 11:
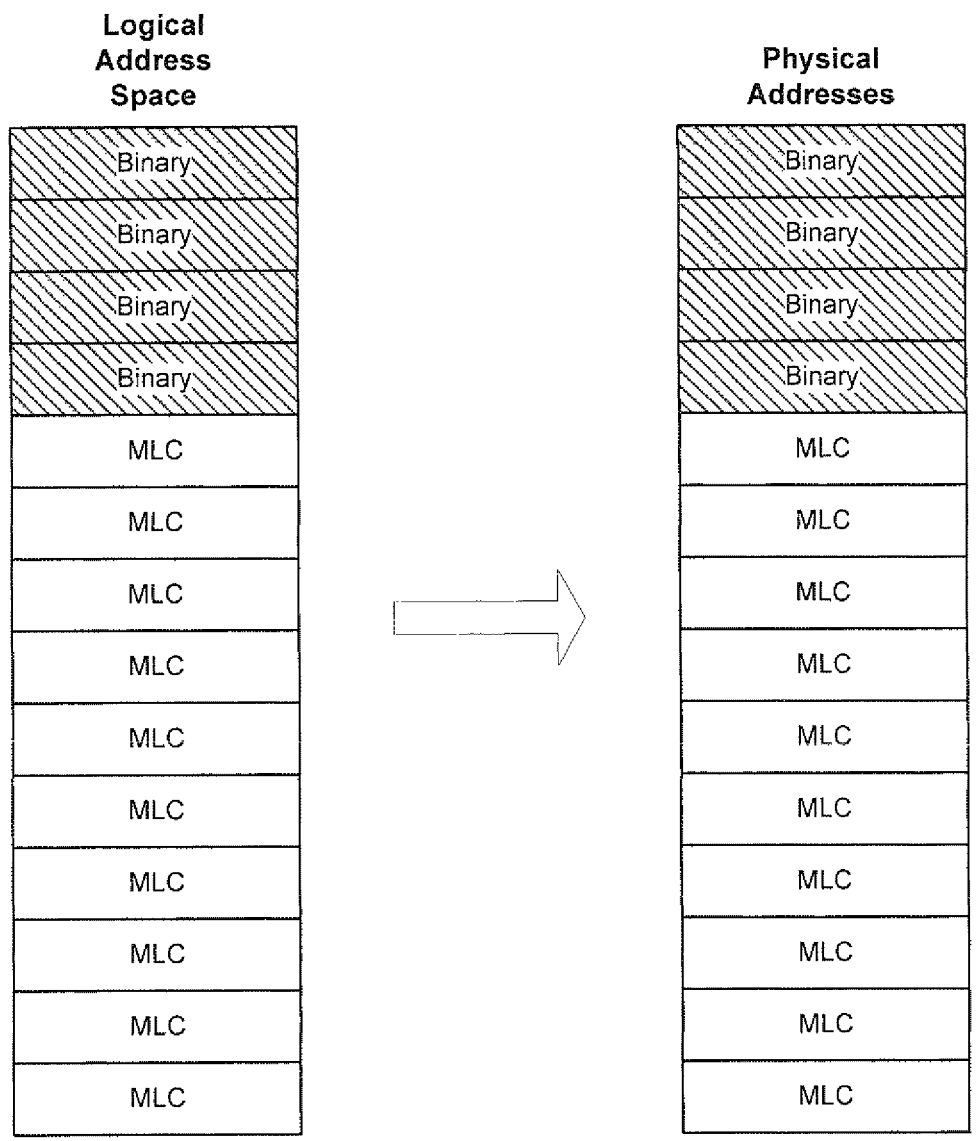
FIG. 11 illustrates mapping of logical addresses of data to physical addresses in a memory array.

In a typical memory system, data is received from a host as units of data each with an address that the host associates with the unit of data. The unit of data may be a cluster made up of multiple sectors of data, each sector containing 512 bytes of host data (plus some overhead). Each cluster has an associated address that may be considered a Logical Block Address (LBA). In general, the memory system associates the LBA from the host with a physical address of an area of the memory array and maintains a record of this association in a logical-to-physical map. This allows updated data from the host to be stored at a different location from an older version of the same data (i.e. it allows data with the same LBA to be stored in different physical locations in the memory array). However, even with such logical-to-physical mapping there is a tendency for binary data and MLC data to remain somewhat separate. FIG. 11 shows an example where a host logical address space has four LBAs assigned to binary data and the remaining logical address space assigned to MLC data. When this address space is mapped to physical address space all the binary data is sent to four blocks that are physically contiguous in the memory array and thus form an aggressor block. Such a mapping may occur when a memory is initially used, before it becomes fragmented, or may occur even after substantial use because of the way binary data is handled by the memory system. In many cases, it is easier for the memory system to maintain binary blocks in a contiguous arrangement and such a simple arrangement may provide some advantages.

According to an embodiment of the present invention, a separation scheme is used to prevent clustering of binary cache blocks that if clustered together could cause data retention problems in neighboring MLC blocks. A separation scheme may ensure that binary blocks are distributed in the memory array so that there always at least some minimum spacing between binary blocks.

Figure 12:
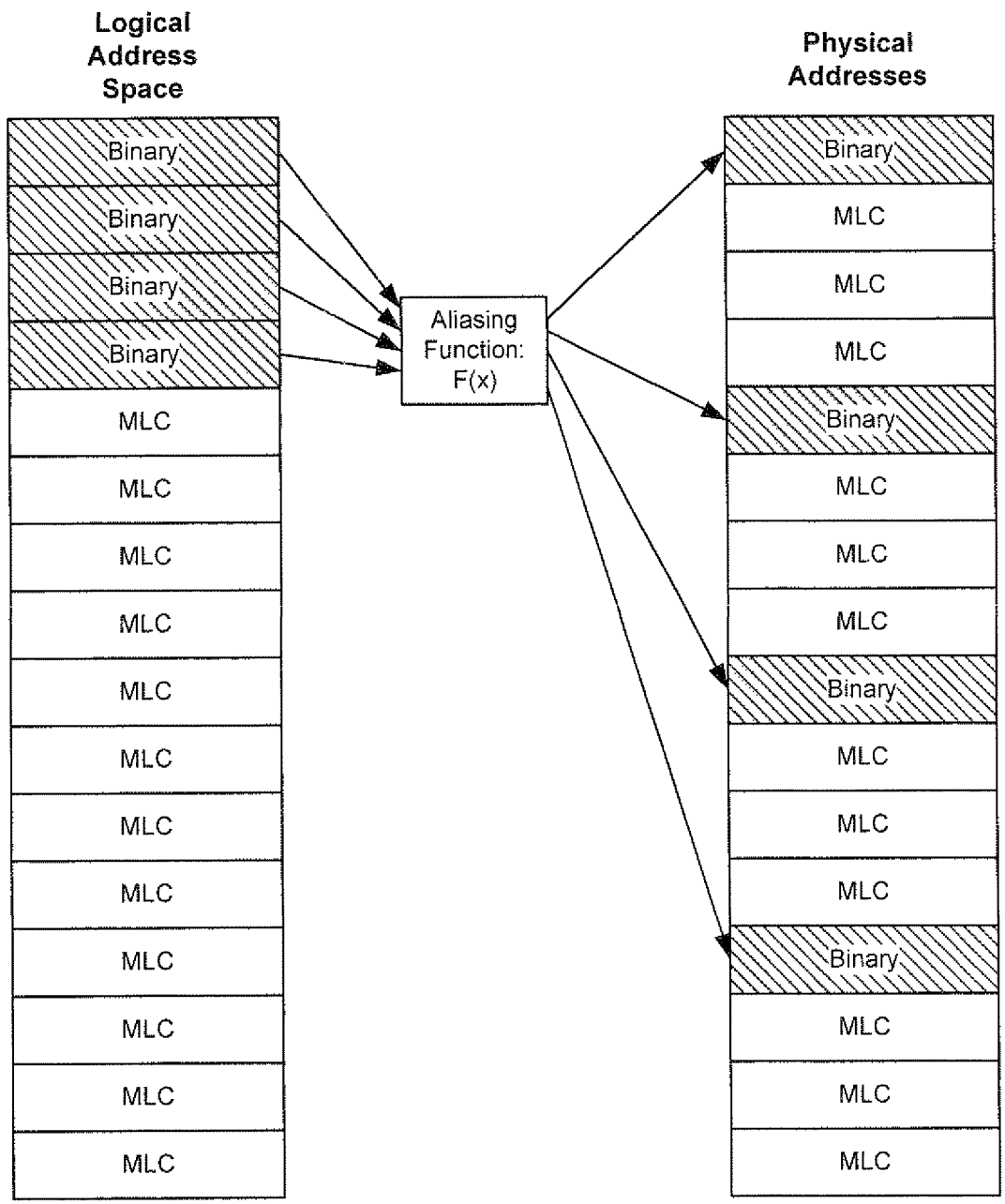
FIG. 12 illustrates an aliasing function that provides a fixed separation between binary blocks in a memory array.

FIG. 12 shows an example of a separation scheme based on an aliasing function which performs logical-to-physical mapping of LBAs to physical locations in the memory array to ensure that binary blocks are separated by at least a minimum spacing. In this example, binary blocks are separated by three MLC blocks according to a fixed spacing that is used throughout the memory array. The spacing may exceed some minimum spacing (e.g. two-block spacing) and may be based on experimental data that shows that, for example, a two-block spacing is sufficient to prevent data retention problems. The spacing may also be determined by the ratio of binary blocks to MLC blocks. In this example, there are four binary blocks and twelve MLC blocks giving a ratio of one to three (1:3). So binary blocks are distributed with three MLC blocks between any two binary blocks giving the largest spacing between binary blocks that can be attained (even if a smaller spacing may be sufficient).

Figure 13:
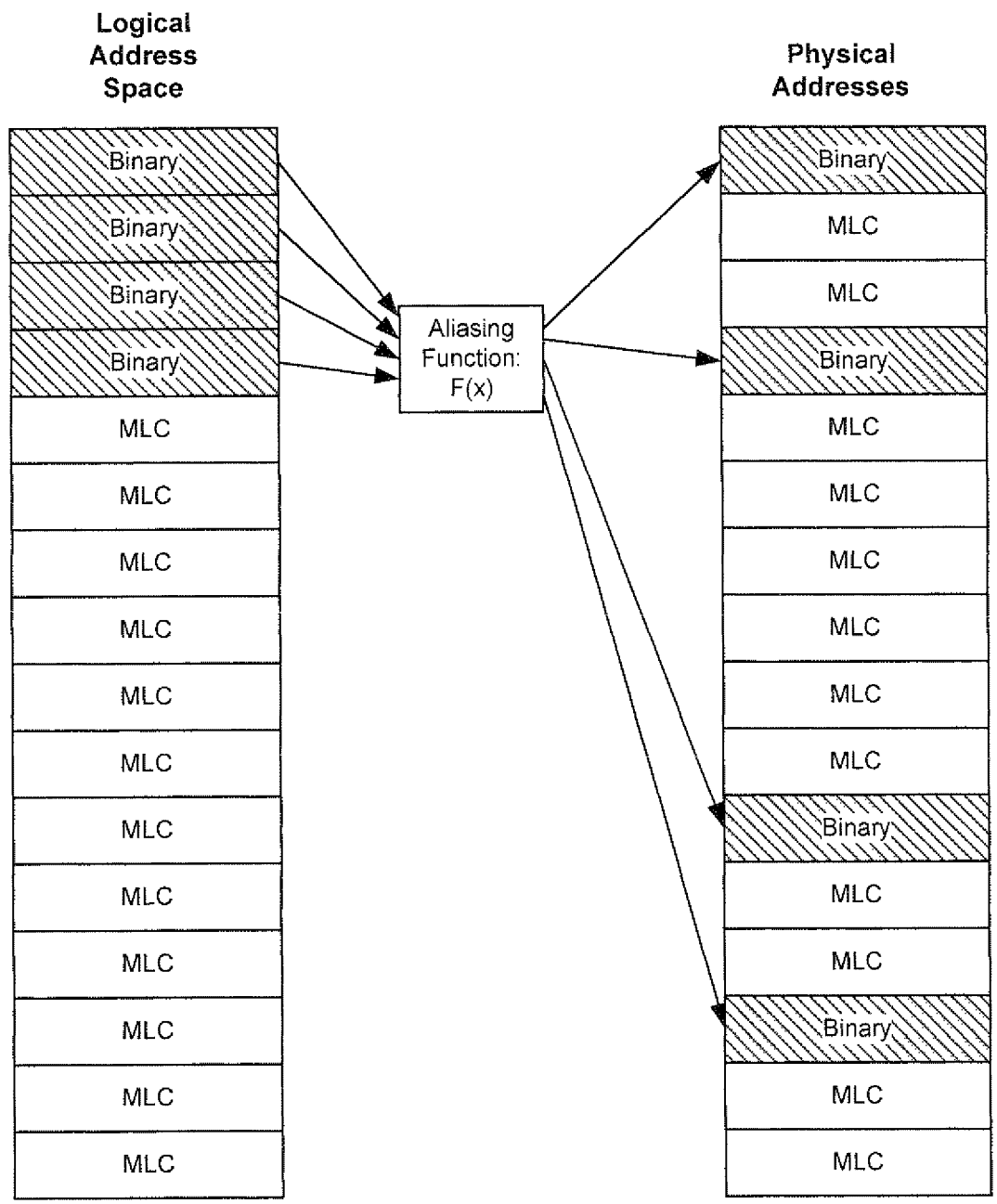
FIG. 13 illustrates another aliasing function that provides a variable separation between binary blocks in a memory array.

FIG. 13 shows an alternative aliasing function that does not use a fixed spacing between binary blocks but instead assigns binary blocks to physical locations according to an algorithm that provides variable spacing between binary blocks but always ensures that the variable spacing is greater than some minimum spacing. FIG. 13 shows that there are at least two MLC blocks between any two binary blocks although some binary blocks are separated by much more than two binary blocks. An algorithm may seek a physical location for storage of binary data by looking for an available physical block (an erased block or block that is scheduled for erase) that is at least a minimum distance from any other binary block in the same plane. The first physical block to be at least the minimum distance from any other binary block may be chosen. Another algorithm may seek a physical block that is the furthest away from any other binary block so that separation is maximized. In some systems, it may be permissible for multiple binary blocks to remain together as long as they do not reach a threshold number at which they could form an aggressor block. The threshold number may be different for different memory systems. For example, two, or three binary (or other low charge-density) blocks might be permitted to remain together, but when a fourth binary block is needed an aliasing scheme could assign it to a location that is physically separate from the previous three blocks. Thus, the formation of an aggressor block would be avoided.

While the above examples refer to separation of binary blocks (in particular binary cache blocks) in memories that contain both binary blocks and MLC blocks, the present invention is not limited to such examples. In some cases, a memory array may contain data in different data storage formats that cause some blocks to store less charge than others. Blocks storing less charge in such memory arrays may be distributed using a separation scheme so that data retention problems do not occur in neighboring blocks that store more charge. In any memory array in which stored charge is used to represent data, different data storage formats may result in different charge densities and this may affect data retention. Distributing blocks that contain data in a particular format may reduce or eliminate data retention problems associated with clustering of blocks that contain data in a particular format.

The present invention may be combined with other techniques to improve data retention. For example, blocks that contain only obsolete data may be maintained with obsolete data until they are needed for writing new data, at which point they are erased. Such an erase-before-write scheme may reduce the number of erased blocks in the memory array at any time by deferring erase operations until immediately prior to writing new data. (This is in contrast to schemes that erase blocks soon after they are found to contain only obsolete data, and then maintains the erased blocks in an erased block pool that may represent a significant portion of the blocks of the memory array.) A separation scheme may be used with the techniques described in US Patent Publication No. 2011/0075482 so that the effects of both erased blocks and binary cache blocks (or other low charge formats) on data retention are limited.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of assigning locations for two-state data storage in a nonvolatile memory that stores data in both two-state per cell form and multi-state per cell form, comprising:
   assigning a first physical location for storage of a first unit of data in two-state per cell form in relation to a second physical location of a second unit of data in two-state per cell form according to a separation scheme such that the first physical location and the second physical location are separated by at least a predetermined minimum number of physical locations that store data in multi-state per cell form; and assigning a third physical location for storage of a third unit of data in two-state per cell form according to the separation scheme such that the third physical location is separated from the first physical location by at least the predetermined minimum number of physical locations that store data in multi-state per cell form, and the third physical location is separated from the second physical location by at least the predetermined minimum number of physical locations that store data in multi-state per cell form.

2. The method of claim 1 wherein each physical location corresponds to an erase block.

3. The method of claim 1 wherein the first location and the second location are in the same plane of the nonvolatile memory.

4. The method of claim 3 wherein the separation scheme is applied without regard to physical locations of units of data in two-state per cell form that are stored in other planes of the nonvolatile memory.

5. The method of claim 1 wherein the minimum number is calculated from the number of erase blocks in the memory array and the number of erase blocks needed for two-state per cell storage.

6. The method of claim 1 wherein the separation scheme assigns the first physical location and the second physical location according to a repetitive pattern that maintains a fixed separation between erase blocks containing data in two-state per cell form.

7. The method of claim 1 wherein the separation scheme assigns the first physical location and the second physical location according to an algorithm that allows a variable separation between erase blocks containing data in two-state per cell form, the variable separation being at least the predetermined minimum number of physical locations.

8. A method of assigning physical addresses for storage of data in low charge-density format, and high charge-density format, in a nonvolatile floating gate memory array, comprising:

assigning physical addresses for storage of data in low charge-density format in a repeating pattern with intervals between the physical addresses for storage of data in low charge-density format; and assigning data in high charge-density format to the intervals between the physical addresses for storage of data in low charge-density format.

9. The method of claim 8 wherein low charge-density format is storage of one bit of data per memory cell, and high charge-density is storage of more than one bit of data per memory cell.

10. The method of claim 8 wherein low charge-density format is storage using a first number of memory states per cell and high charge-density format is storage using a second number of memory states per cell, the second number being greater than the first number.

11. A nonvolatile floating-gate memory system comprising:

an array of floating-gate memory cells, an individual cell of the array of floating-gate memory cells being configurable to either (a) store one bit of data, or (b) store more than one bit of data; and a physical assignment unit that assigns units of data that are to be stored in the array of floating-gate memory cells to physical locations in the array of floating-gate memory cells according to a separation scheme such that first portions of the memory array that store one bit of data per cell are separated from each other by second portions of the memory array that store more than one bit of data per cell wherein the array of floating-gate memory cells are formed in planes, with each plane having a separate well providing isolation from other planes, and wherein within an individual plane, erase blocks of cells configured to store one bit of data per cell are separated by at least a minimum number of erase blocks of cells configured to store more than one bit per cell.

12. The nonvolatile floating-gate memory system of claim 11 wherein erase blocks of cells configured to store one bit of data per cell are separated from each other by a uniform number of erase blocks of cells configured to store more than one bit per cell.

13. A method of assigning locations for two-state data storage in a nonvolatile memory that stores data in both two-state per cell form and multi-state per cell form, comprising:

assigning a first physical location for storage of a first unit of data in two-state per cell form in relation to a second physical location of a second unit of data in two-state per cell form according to a separation scheme such that the first physical location and the second physical location are separated by at least a predetermined minimum number of physical locations that store data in multi-state per cell form;

wherein the separation scheme assigns the first physical location and the second physical location according to an algorithm that allows a variable separation between erase blocks containing data in two-state per cell form, the variable separation being at least the predetermined minimum number of physical locations.

14. The method of claim 13 wherein each physical location corresponds to an erase block.

15. The method of claim 13 wherein the first location and the second location are in the same plane of the nonvolatile memory.

16. The method of claim 15 wherein the separation scheme is applied without regard to physical locations of units of data in two-state per cell form that are stored in other planes of the nonvolatile memory.

* * * * *